(12) United States Patent
McGoldrick et al.

(10) Patent No.: US 7,788,564 B2
(45) Date of Patent: Aug. 31, 2010

(54) ADJUSTABLE TEST PATTERN RESULTS LATENCY

(75) Inventors: Michael F. McGoldrick, North Reading, MA (US); William T. Borroz, West Newton, MA (US); Stephen K. Eng, Andover, MA (US); David A. Milley, Merrimac, MA (US)

(73) Assignee: Teradyne, Inc., North Reading, MA (US)

( * ) Notice: Subject to any disclaimer, the term of this patent is extended or adjusted under 35 U.S.C. 154(b) by 440 days.

(21) Appl. No.: 11/986,508

(22) Filed: Nov. 21, 2007

(65) Prior Publication Data

US 2009/0100303 A1    Apr. 16, 2009

Related U.S. Application Data

(60) Provisional application No. 60/998,763, filed on Oct. 12, 2007.

(51) Int. Cl.
 *G06F 11/00* (2006.01)
(52) U.S. Cl. .................................. 714/738; 714/744
(58) Field of Classification Search ................. 714/738, 714/744
 See application file for complete search history.

(56) References Cited

U.S. PATENT DOCUMENTS

| | | | |
|---|---|---|---|
| 6,167,352 A * | 12/2000 | Kanevsky et al. ............. | 702/81 |
| 6,493,839 B1 * | 12/2002 | Miner ......................... | 714/718 |
| 6,591,211 B1 * | 7/2003 | Schnarch .................... | 702/108 |
| 6,675,339 B1 | 1/2004 | Lanier et al. | |
| 7,287,204 B2 * | 10/2007 | Mayer et al. ................ | 714/719 |
| 7,363,556 B2 * | 4/2008 | Doi et al. .................... | 714/718 |
| 7,490,279 B1 * | 2/2009 | Kumar et al. ............... | 714/733 |
| 7,590,903 B2 * | 9/2009 | Volkerink et al. ........... | 714/725 |
| 2002/0188902 A1 * | 12/2002 | Fan et al. .................... | 714/724 |
| 2003/0093736 A1 * | 5/2003 | Grey .......................... | 714/738 |
| 2004/0015749 A1 | 1/2004 | Ziegler et al. | |
| 2007/0300114 A1 * | 12/2007 | Doi ............................ | 714/735 |

OTHER PUBLICATIONS

C. Jones et al., "*User-Centric Digital Test Architecture*", IEEE Autotestcon, Sep. 26-29, 2005.
L-Series Language Manual, Teradyne, Inc., 3 pages, 2009.
M9—Series Digital Test Instrument Help, Teradyne, Inc., 6 pages, 2009.

* cited by examiner

*Primary Examiner*—Kevin L Ellis
*Assistant Examiner*—Steve Nguyen
(74) *Attorney, Agent, or Firm*—Wolf, Greenfield & Sacks, P.C.

(57) ABSTRACT

A digital test instrument and a test method provide adjustable results latency. A digital test instrument includes a pattern controller configured to generate a sequence of test patterns, responsive, at least in part, to a pass/fail result, a pattern memory configured to supply the generated sequence of test patterns to a unit under test, a pattern results collection unit configured to receive at least one result value from the unit under test and to determine a pass/fail result for at least one supplied test pattern, and a synchronization unit configured to provide a no-result indication to the pattern controller during a preset number of pattern cycles following the start of a test, the preset number of pattern cycles based on a results latency of the test instrument, and to provide pass/fail results to the pattern controller after the preset number of pattern cycles.

20 Claims, 8 Drawing Sheets

Example Circuit

Example Test Program

Pattern 1:
    Drive High CLOCK IN,
    Test Low OUTPUT 3,
    Test Low OUTPUT 2,
    Test Low OUTPUT 1,
    Test Low OUTPUT 0

Pattern 2:
    Drive Low CLOCK IN

Pattern 3:
    No Change

Pattern 4:
    No Change

Pattern 5:
    <Pass/fail result from Pattern 1 available>
    If Pattern 1 Failed, Go to Pattern 1

Pattern 6:
    <counter @ 0, continue with rest of test>

First Digital Test Instrument with Pass/Fail Results Latency = 4:

| Pattern Executed | Available Response | Notes |
|---|---|---|
| Pattern 1 | none | Assume counter at 0xE initially for this example |
| Pattern 2 | none | Counter advances to 0xF |
| Pattern 3 | none | |
| Pattern 4 | none | |
| Pattern 5 | Pattern 1 | Pattern 1 failed – redo loop |
| 2nd Pattern 1 | Pattern 2 | Counter rolls over to 0 |
| 2nd Pattern 2 | Pattern 3 | |
| 2nd Pattern 3 | Pattern 4 | |
| 2nd Pattern 4 | Pattern 5 | |
| 2nd Pattern 5 | 2nd Pattern 1 | 2nd pattern 1 passed, loop exits |
| Pattern 6 | 2nd Pattern 2 | |
| etc. | | |

FIG. 2

Second Digital Test Instrument with Pass/Fail Results Latency = 9:

| Pattern Executed | Available Response | Notes |
|---|---|---|
| Pattern 1 | none | Assume counter at 0xE initially for this example |
| Pattern 2 | none | Counter advances to 0xF |
| Pattern 3 | none | |
| Pattern 4 | none | |
| Pattern 5 | none | No result available – redo loop |
| 2nd Pattern 1 | none | Counter rolls over to 0 |
| 2nd Pattern 2 | none | |
| 2nd Pattern 3 | none | |
| 2nd Pattern 4 | none | |
| 2nd Pattern 5 | Pattern 1 | 1st pattern 1 failed – redo loop |
| 3rd Pattern 1 | Pattern 2 | Counter advances to 1 |
| 3rd Pattern 2 | Pattern 3 | |
| 3rd Pattern 3 | Pattern 4 | |
| 3rd Pattern 4 | Pattern 5 | |
| 3rd Pattern 5 | 2nd Pattern 1 | 2nd Pattern 1 passed, loop exits |
| Pattern 6 | 2nd Pattern 2 | OOPS – Counter @ 1, not 0!! |
| etc. | | |

FIG. 3

| Results Condition | Pass | Fail |
|---|---|---|
| No Result | 0 | 0 |
| Pass | 1 | 0 |
| Fail | 0 | 1 |
| Undefined | 1 | 1 |

Conditional Logic Finite State Machine Truth Table

| Incoming Pattern Result | Counter @ 0 | Old Pass Cond | Old Fail Cond | New Pass Cond | New Fail Cond |
|---|---|---|---|---|---|
| X | No | X | X | False | False |
| Fail | Yes | X | X | False | True |
| Pass | Yes | X | X | True | False |
| No Result | Yes | False | False | False | False |
| No Result | Yes | False | True | False | True |
| No Result | Yes | True | False | True | False |

FIG. 8B

ADJUSTABLE TEST PATTERN RESULTS LATENCY

CROSS-REFERENCE TO RELATED APPLICATION

This application claims priority based on provisional application Ser. No. 60/998,763, filed Oct. 12, 2007, which is hereby incorporated by reference in its entirety.

FIELD OF THE INVENTION

This invention relates to digital test instruments and methods and, more particularly, to digital test instruments and methods which use pattern results to dynamically alter the sequence of patterns executed in a test.

BACKGROUND OF THE INVENTION

Digital test instruments apply test stimuli to and collect test responses from units under test (UUTs) across several channels simultaneously during the execution of a functional digital test. A typical digital functional test includes a sequence of patterns. Each pattern includes specifications of the test stimulus to apply and/or test response to collect, as well as the timing for those actions.

Digital test instruments typically provide a way to compare collected test responses with expected responses and to produce for each channel in the instrument a pass or fail test result that indicates whether the actual response matches the expected response for that channel on a particular pattern. The individual channel results on a pattern are logically combined to produce an overall test result for that pattern. Pattern results, in turn, are logically combined to produce an overall test result for the complete test.

A digital test instrument may include a hardware component called a pattern controller that determines the particular sequence of patterns executed during a digital test. In such an instrument, the instructions for generating test stimuli and/or collecting test responses are stored in pattern memory and the instructions for a particular pattern are found at a particular address within that memory. The pattern controller generates the sequence of test patterns for a test by controlling the sequence of addresses applied to the pattern memory. In a simple test, the pattern controller can produce a linear sequence of patterns by incrementing the pattern memory address. In more complicated tests, the pattern controller may produce sequences of pattern memory addresses that skip over certain patterns, or may cause groups of patterns to execute several times during the execution of a test.

Normally, pattern results are simply stored in the digital test instrument hardware during test execution, and retrieved after the test has completed execution to provide diagnostic information to help isolate and diagnose faults on a UUT. However, digital test instruments may also use pattern results to dynamically alter the sequence of patterns executed in a test. To accomplish this, the test instrument is typically designed so that on a particular pattern the pattern controller can take one of two actions based on the setting of the overall test result for the pattern.

The delay between the time when the test pattern is applied to the unit under test and the time when the result of the test pattern is applied to the pattern controller is termed the pass/fail results latency, or simply the results latency. In high speed test instruments that rely on pipelining techniques to achieve their high speed performance, this latency is usually expressed in terms of a number of patterns. The user of the digital test instrument must account for this latency when writing a test program that runs on the instrument and uses its conditional execution capability.

As an example, consider a test application, shown in FIGS. 1A and 1B, in which a digital test instrument with a results latency of four patterns is used to detect when a synchronous counter 10 reaches the zero state on its outputs. Patterns 1-5 form a conditional loop that clocks the counter once per loop iteration and exits when the counter outputs are all low.

Digital functional test programs are expensive to develop, and once validated and deployed, there can be a tremendous reluctance to modify them. Such test programs can last for many years, and can easily outlast the test equipment on which the test programs were originally designed to run. When such a test program is migrated to a new test system with different digital test instruments, the new digital test instruments should provide the same results latency as that of the original digital test instruments.

However, as a general trend, the maximum speed of digital test instruments has increased over time. Higher operating speeds mean more pipeline stages, and a higher results latency. This increased latency can "break" working test programs.

FIG. 2 is an execution trace example that illustrates operation of the test program of FIG. 1B on a first digital test instrument having a results latency of four pattern cycles. As shown in FIG. 2, the test program runs properly on the first digital test instrument.

FIG. 3 is an execution trace example that illustrates operation of the test program of FIG. 1B on a second digital test instrument having a results latency of nine pattern cycles. As shown in FIG. 3, the test program fails to run properly on the second digital test instrument.

As a result, there is a need for digital test instruments and test methods which overcome the problem of running existing test programs on digital test instruments which have different results latencies.

SUMMARY OF THE INVENTION

The invention provides a solution to one aspect of the problem of running existing test programs on newer digital test instrumentation through an alternative approach to pass/fail test results collection and distribution. Rather than using a fixed pipeline-based method for processing test results, the invention provides a framework for configuring the test results latency to match the requirements of the test program, allowing it to run in its original validated state.

According to a first aspect of the invention, a digital test instrument is provided. The digital test instrument comprises a pattern controller configured to generate a sequence of test patterns, responsive, at least in part, to a pass/fail result, a pattern memory configured to supply the generated sequence of test patterns to a unit under test, a pattern results collection unit configured to receive at least one result value from the unit under test and to determine a pass/fail result for at least one supplied test pattern, and a synchronization unit configured to provide a no-result indication to the pattern controller during a preset number of pattern cycles following the start of a test, the preset number of pattern cycles based on a results latency of the test instrument, and to provide pass/fail results to the pattern controller after the preset number of pattern cycles.

According to a second aspect of the invention, a method for digital testing is provided. The method comprises generating, in a pattern controller, a sequence of test patterns, responsive, at least in part, to a pass/fail result, supplying the generated sequence of test patterns to a unit under test, determining a pass/fail result for at least one supplied test pattern in response to result values received from the unit under test, wherein the pass/fail result is available after a results latency, providing a no-result indication to the pattern controller during a preset number of pattern cycles following the start of a test, the preset number of pattern cycles based on the results latency, and providing the pass/fail results to the pattern controller after the preset number of pattern cycles.

According to a third aspect of the invention, a method for digital testing is provided. The method comprises generating, in a pattern controller, a sequence of test patterns, responsive, at least in part, to a pass/fail result; supplying the generated sequence of test patterns to a unit under test; determining a pass/fail result for at least one supplied test pattern in response to result values received from the unit under test; selecting a results condition comprising a no-result indication during a preset number of pattern cycles following the start of a test and selecting a results condition comprising pass/fail results after the preset number of pattern cycles; and providing the selected results condition to the pattern controller.

BRIEF DESCRIPTION OF THE DRAWINGS

For a better understanding of the present invention, reference is made to the accompanying drawings, which are incorporated by reference and in which:

FIG. 2 is an execution trace example that illustrates operation of the test program of FIG. 1, in accordance with the prior art, on a first digital test instrument having a results latency of four pattern cycles;

FIG. 3 is an execution trace example that illustrates operation of the test program of FIG. 1, in accordance with the prior art, on a second digital test instrument having a results latency of nine pattern cycles;

FIG. 8B is a truth table for the condition logic finite state machine of FIG. 8A.

DETAILED DESCRIPTION

Figures 1A, 1B:
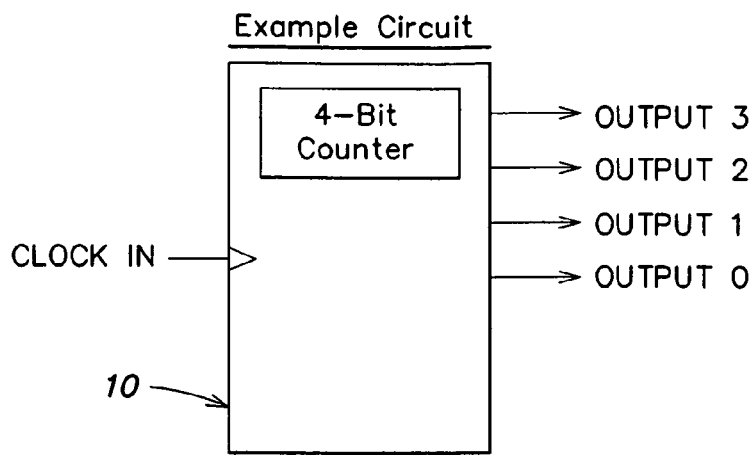
FIG. 1A illustrates an example of a circuit to be tested.
FIG. 1B illustrates a simplified example of a test program for the circuit of FIG. 1A.
Figure 4:
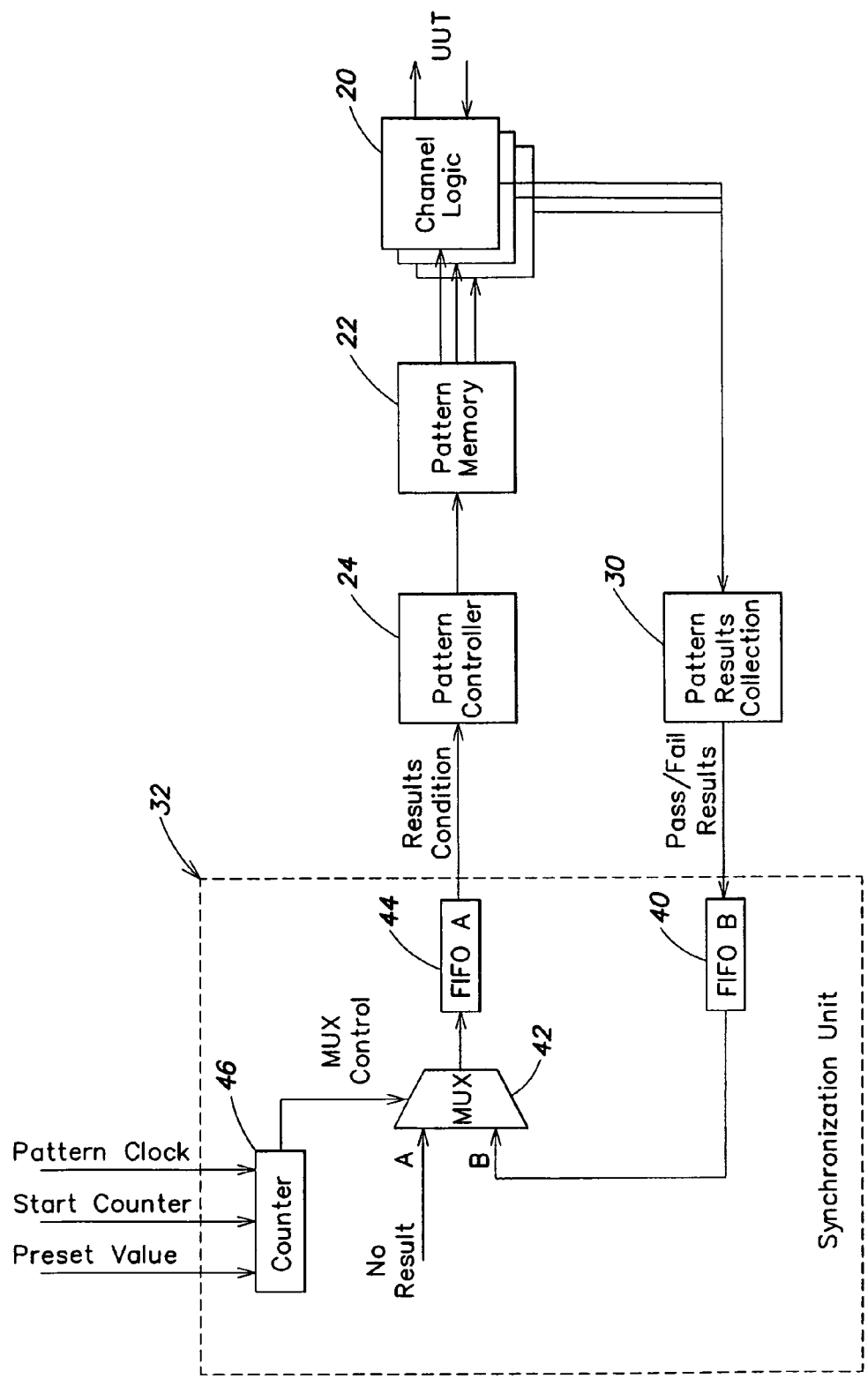
FIG. 4 is a simplified block diagram of a digital test instrument in accordance with an embodiment of the invention.

A simplified block diagram of a digital test instrument in accordance with a first embodiment of the invention is shown in FIG. 4. A channel logic block 20 represents the logic on the digital test instrument that is responsible for controlling the application of test patterns to and collecting test responses from a UUT on each channel in the digital test instrument. The set of test patterns and expected responses are stored in a pattern memory 22. A pattern controller 24 controls the address lines for the pattern memory 22, producing the sequence of test patterns and response collections. The pattern controller 24 is a processor that executes a test program by accessing a sequence of instructions in pattern memory 22 and producing test patterns that are applied to the unit under test. A pattern results collection unit 30 includes the logic that combines the various test result values from each of the channels for each pattern to produce an overall pass/fail test result for the pattern.

The digital test instrument further includes a synchronization unit 32 which receives pass/fail results from pattern results collection unit 30 and provides results conditions to pattern controller 24. The synchronization unit 32 provides a no-result indication to the pattern controller 24 during a preset number of pattern cycles following the start or restart of a test. The preset number of pattern cycles corresponds to the results latency of the test instrument. The synchronization unit 32 provides pass/fail results to the pattern controller 24 after the preset number of pattern cycles.

In the embodiment of FIG. 4, synchronization unit 32 includes a FIFO 40, a mux 42, a FIFO 44 and a counter 46. FIFO 40 receives and stores pass/fail results generated by pattern results collection unit 30. Mux 42 may be a 2:1 multiplexer having a first input which receives the no-result indication, a second input which receives pass/fail results from FIFO 40 and a control input coupled to counter 46. The output of mux 42 is coupled to the input of FIFO 44. FIFO 44 provides results conditions to pattern controller 24. The results conditions may affect the sequences of test patterns produced by pattern controller 24. Counter 46 controls mux 42 and therefore controls the source of the results condition supplied to FIFO 44.

Initially, the mux 42 is set so that a value indicating "no result" is passed to FIFO 44 and subsequently to the pattern controller 24. The counter 46 is configured to count down on each pattern from a preset value to zero. When the counter 46 reaches zero, it switches the source of the input to FIFO 44 from the "no result" indication to the output of FIFO 40.

FIFO 44 produces a new value of the results condition for every test pattern the pattern controller 24 generates. The first N values of the results condition, where N is determined from the preset value of the counter 46, are the no-result indication. The N+1st value is the first pass/fail result supplied to FIFO 40, which is the test result for the first pattern of the test. The first pass/fail result supplied to pattern controller 24 is the result of the first test pattern executed by the pattern controller. No pass/fail results are skipped or omitted; they are simply delayed in becoming available to the pattern controller. The value of N is preset based on the results latency and is programmable to allow the digital test instrument to emulate a variety of digital test instruments.

By way of example, the pattern controller 24 may receive a two-bit results condition from FIFO 44, including a pass bit and a fail bit. A set state of the pass bit indicates pass, and a set state of the fail bit indicates fail. In this example, each input of mux 42 has a width of two bits, and FIFO 44 has a width of two bits. The pattern controller 24 is programmed by the test program to take a specified action, i.e., alter its operation, in response to one of the two bits being set. When the pattern controller 24 receives the no-result indication, both bits are reset and the specified action is not taken. Examples of actions taken by pattern controller 24 in response to the pass/fail result include, but are not limited to, jumping to another location in the test program, repeating or exiting from a loop in the test program, halting the test program and continuing with the next instruction in an instruction sequence.

The pattern controller 24 is typically configured to alter its operation based on whether a single condition (pass or fail) is true. The no-result indication forces both the pass and fail conditions to be false, and the pattern controller 24 does not alter its operation. When the pattern controller is configured to alter its operation in response to a true state of the pass condition, neither a true state of the fail condition nor a no-result indication alters the operation. Similarly, when the pattern controller is configured to alter its operation in response to a true state of the fail condition, neither a true state of the pass condition nor a no-result indication alters the operation.

In the embodiment of FIG. 4, counter 46 may be preset with a value that is based on the results latency of the digital test instrument. By way of example only, where the digital test instrument has a results latency of N+1 pattern cycles, counter 46 may be preset to a value that causes the mux control line to change states after N pattern cycles. Preset values corresponding to different results latencies may be utilized. Counter 46 is enabled by a start counter signal and is clocked by a pattern clock. Each pattern clock cycle corresponds to a new test pattern generated by pattern controller 24. The start counter signal may be provided initially at the start of a test or when a test is resumed after a reset of pattern controller 24. The start counter signal and the pattern clock may be provided by pattern controller 24.

In one embodiment, counter 46 is clocked by the pattern clock so as to count down from the preset value to zero. The output provided to mux 42 remains in a first state which selects the no-result indication until the counter 46 counts down to zero. Thereafter, the output of counter 46 switches to a second state which selects the pass/fail results provided from FIFO 40 to mux 42. It will be understood that different configurations may be utilized for controlling mux 42 within the scope of the invention.

For a results latency of N+1 pattern cycles, the counter or other mux control logic is configured to select the no-result indication from the start of the test until the end of pattern cycle N and to select the pass/fail result thereafter. Thus, the no-result indication is selected until the pattern cycle in which the pass/fail result is available to the pattern controller 24. It will be understood that different mux control techniques can be utilized, including counting up or counting down to a specified number, such as zero, and that other mux control logic configurations can be utilized within the scope of the invention. In any of the mux control techniques, the number of pattern cycles during which the no-result indication is provided to the pattern controller may be programmable to accommodate different values of results latency.

In the embodiment of FIG. 4, FIFO 40 serves as a buffer between pattern results collection unit 30 and mux 42. Similarly, FIFO 44 serves as a buffer between mux 42 and pattern controller 24. In some embodiments, one or both of FIFOs 40 and 44 may be omitted.

Figure 5:
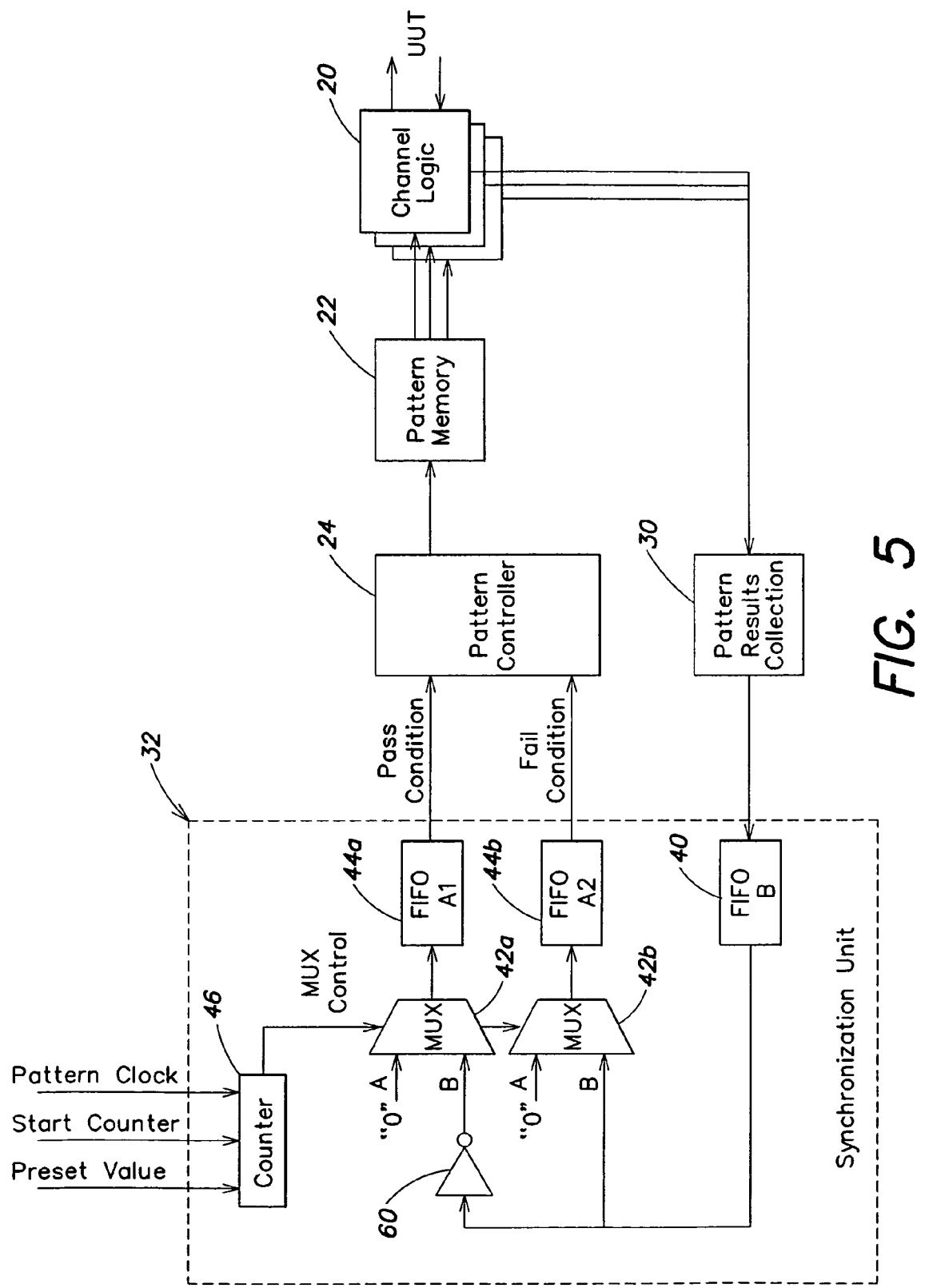
FIG. 5 is a simplified block diagram of a digital test instrument showing a first example of an implementation of the synchronization unit.

FIG. 5 is a simplified block diagram of a digital test instrument showing a first example of an implementation of the synchronization circuit. Like elements in FIGS. 4 and 5 have the same reference numerals. In the implementation of FIG. 5, pattern results collection unit 30 produces a single bit pass/fail result. FIFO 40 receives the pass/fail result from pattern results collection unit 30 and provides the pass/fail result to a B input of a mux 42b and to an inverter 60. The output of inverter 60 supplies an inverted pass/fail result to a B input of a mux 42a. A "0" logic level is supplied to A inputs of muxes 42a and 42b. The outputs of muxes 42a and 42b are supplied to FIFOs 44a and 44b. Muxes 42a and 42b receive a mux control signal from counter 46 as described above. FIFO 44a provides a pass condition to pattern controller 24, and FIFO 44b provides a fail condition to pattern controller 24. When the "0" logic level is selected by muxes 42a and 42b, the pass condition and the fail condition are both false. Supplying the "0" logic level to both muxes 42a and 42b guarantees that the pattern controller 24 won't branch based on any pass/fail conditions until the results latency period expires.

In the implementation of FIG. 5, the pass/fail result is encoded so that Fail="1" logic level and Pass="0" logic level. The reverse encoding can be used if the location of inverter 60 is moved from the B input of mux 42a to the B input of mux 42b.

In the implementation of FIG. 5, pattern results collection unit 30 provides a single bit pass/fail result. In other implementations, pattern results collection unit 30 may provide a two bit pass/fail result. An example is described below in connection with FIGS. 8A and 8B.

Figures 6, 7:
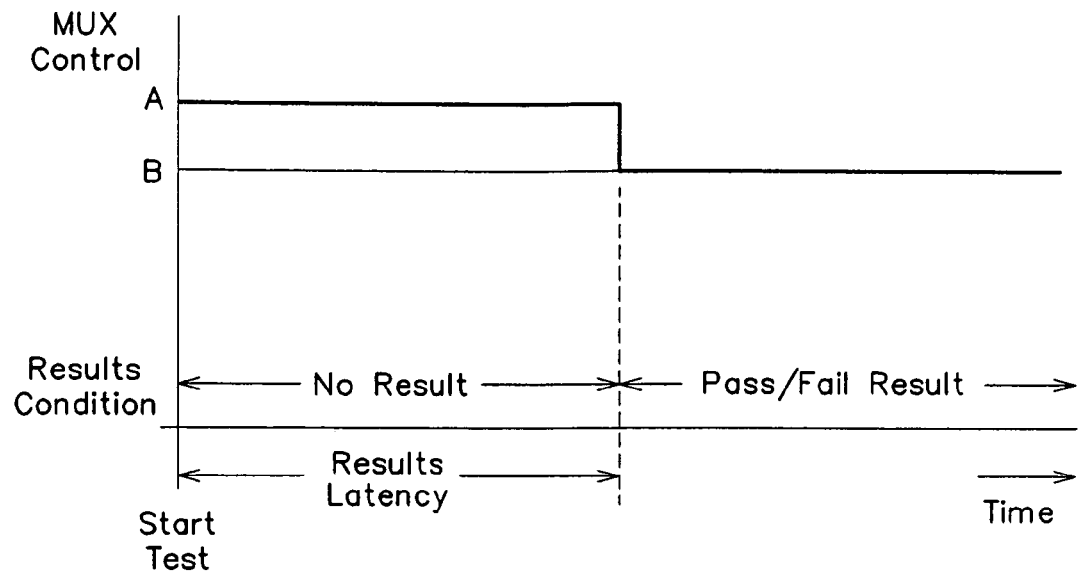
FIG. 6 is a timing diagram that illustrates operation of the synchronization unit.
FIG. 7 is a table that illustrates an example of different results conditions provided to the pattern controller in the implementation of FIG. 5.

A timing diagram that illustrates the operation of the synchronization unit is shown in FIG. 6. As shown in FIG. 6, a mux control signal selects the no-result indication on input A beginning with the start of the test and during a preset number of pattern cycles based on the results latency. Then, the mux control signal switches states and selects the pass/fail result on input B until the test is completed or until the pattern controller 24 is reset or restarted. For a results latency of N+1 pattern cycles, the mux control signal switches states at the end of pattern cycle N.

A table that illustrates an example of results condition states is shown in FIG. 7. In the example of FIG. 7, the results condition has two bits, one of which indicates pass and one of which indicates fail. The no-result condition corresponds to the pass and fail bits both being reset. The set condition of the pass bit or the set condition of the fail bit, depending on the specifics of a test, may cause an alternate action to be taken by pattern controller 24 as described above. The no-result indication does not cause the alternate action to be taken, and pattern controller 24 continues its normal sequence of operations. After the preset number of pattern cycles during which the no-result indication is supplied to pattern controller 24, a pass/fail result is supplied to pattern controller 24 on each pattern cycle. In some embodiments, the pass/fail result may include an identifier of the test pattern. It will be understood that the results condition can have any desired format and number of bits.

Figure 8A:
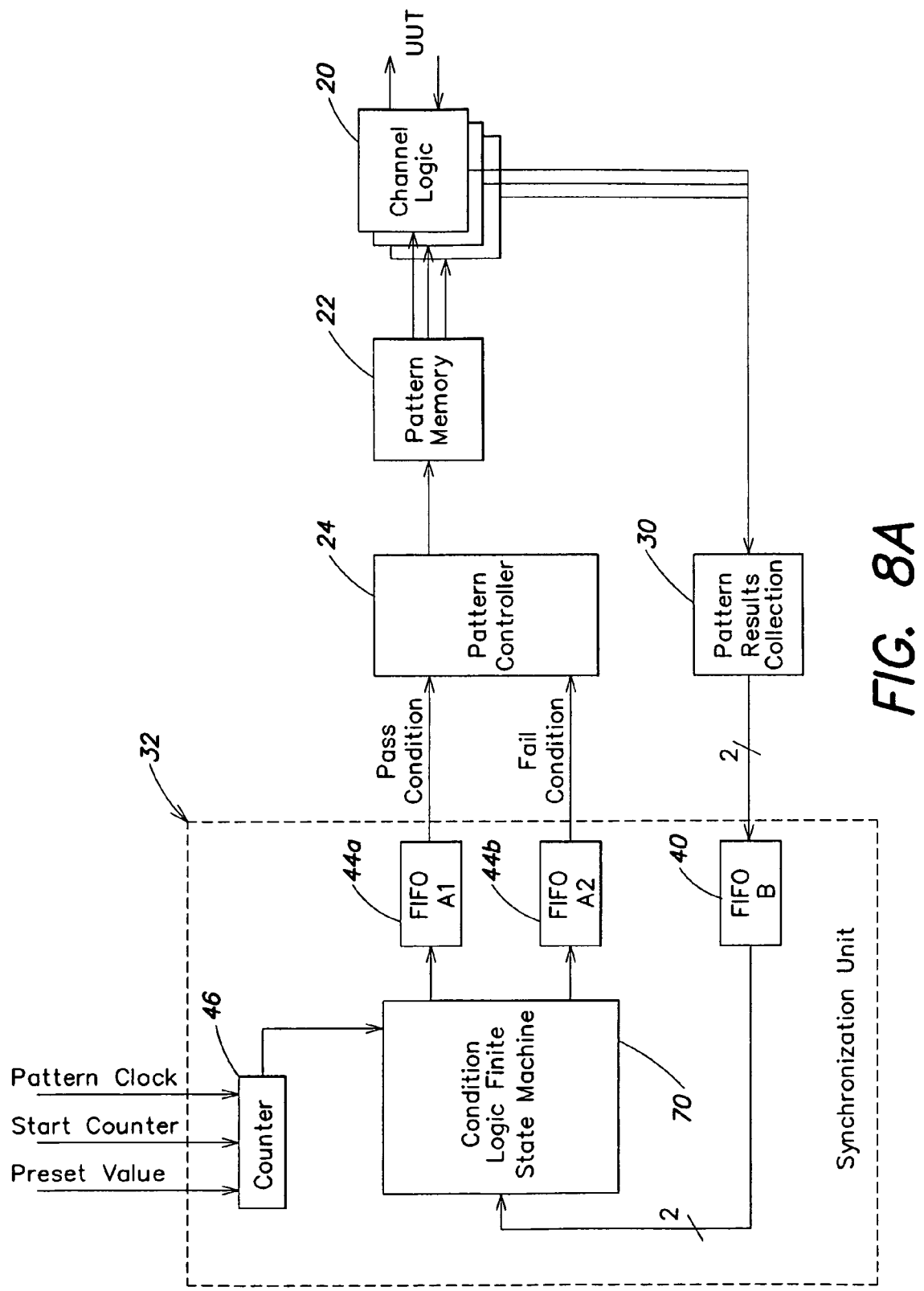
FIG. 8A is a simplified block diagram of a digital test instrument showing a second example of an implementation of the synchronization unit.

FIG. 8A is a simplified block diagram of a digital test instrument showing a second example of an implementation of the synchronization circuit. Like elements in FIGS. 4, 5 and 8A have the same reference numerals. In the implementation of FIG. 8A, pattern results collection unit 30 produces a two-bit pass/fail result. FIFO 40 receives the pass/fail result from pattern results collection unit 30 and provides the two-bit pass/fail result to a condition logic finite state machine 70. The outputs of condition logic finite state machine 70 are supplied to FIFOs 44a and 44b. FIFO 44a provides a pass condition to pattern controller 24, and FIFO 44b provides a fail condition to pattern controller 24.

A truth table of condition logic finite state machine 70 is shown in FIG. 8B. The incoming pattern result from FIFO 40 is shown in the first column, the state of counter 46 is shown in the second column, the pass and fail conditions on the previous pattern cycle are shown in the third and fourth columns, and the pass/fail conditions supplied to FIFOs 44a and 44b, respectively, are shown in the fifth and sixth columns. When counter 46 is not at zero, false states are output on the pass condition and fail condition lines, corresponding to the no-result indication. The remaining states illustrate the outputs when the counter 46 is at zero and the pass/fail results are selected. When a fail result is received from FIFO 40, a true state is output on the fail condition line. When a pass result is received from FIFO 40, a true state is output on the pass condition line. The previous pass/fail conditions are not relevant to these states. The remaining three states illustrate the operation during pattern cycles when no pattern result is received from FIFO 40. In these states, the previous pass/fail condition is maintained for the current pattern cycle. Thus, where the previous pass/fail conditions were both false, the new pass/fail conditions are both false as well. When the previous fail condition was true, a true state is output on the fail condition line. Similarly, when the previous pass condition was true, a true state is output on the pass condition line. The example of FIGS. 8A and 8B accommodates a case where results are generated on some but not all pattern cycles.

The invention provides a general purpose solution to emulating how a variety of older digital test instruments process pattern test results. Currently, digital test instruments have a fixed latency, one that does not necessarily match the requirements of older test programs, but one that is geared to the instruments' usually higher speed operation in comparison to older generation instruments.

In addition, the invention allows the user to implement tests that require zero pattern cycles of latency between when the test is made and when it is acted upon. All this is done without compromising the timing flexibility and programmability of the high-speed, high-performance digital test instrument.

As indicated above, the results latency is typically defined as the delay between the time when the test pattern is applied to the unit under test and the time when the result of the test pattern is applied to the pattern controller. However, the invention is not limited to this definition and can be utilized in any case where it is desired to control application of the pass/fail results to the pattern controller.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A digital test instrument comprising:
a pattern controller configured to generate a sequence of test patterns, responsive, at least in part, to a pass/fail result;
a pattern memory configured to supply the generated sequence of test patterns to a unit under test;
a pattern results collection unit configured to receive at least one result value from the unit under test and to determine a pass/fail result for at least one supplied test pattern; and
a synchronization unit configured to provide a no-result indication to the pattern controller during a preset number of pattern cycles following the start of a test, the preset number of pattern cycles based on a results latency of the test instrument, and to provide pass/fail results to the pattern controller after the preset number of pattern cycles.

2. A digital test instrument as defined in claim 1, further comprising two or more channel logic units coupled between the pattern memory and the unit under test to provide pattern information to individual channels of the unit under test and to receive result values from the individual channels of the unit under test.

3. A digital test instrument as defined in claim 2, wherein the pattern results collection unit is configured to determine a pass/fail result for at least one supplied test pattern as a logical combination of individual channel result values.

4. A digital test instrument as defined in claim 1, wherein the synchronization unit comprises a multiplexer having a first input to receive the no-result indication, a second input to receive pass/fail results and a control input to switch from the no-result indication to the pass/fail results after the preset number of pattern cycles.

5. A digital test instrument as defined in claim 4, wherein the synchronization unit further comprises a first FIFO buffer coupled between an output of the multiplexer and the pattern controller.

6. A digital test instrument as defined in claim 5, wherein the synchronization unit further comprises a second FIFO buffer coupled between the pattern results collection unit and the second input of the multiplexer.

7. A digital test instrument as defined in claim 6, wherein the synchronization unit further comprises a counter having an output coupled to the control input of the multiplexer and configured to count the preset number of pattern cycles.

8. A digital test instrument as defined in claim 1, wherein the pattern controller is configured to alter the sequence of test patterns in response to the pass/fail results.

9. A digital test instrument as defined in claim 1, wherein the synchronization unit is configured so that the number of pattern cycles during which the no-result indication is provided to the pattern controller is programmable.

10. A digital test instrument as defined in claim 1, wherein the synchronization unit is configured to provide the no-result indication to the pattern controller during the preset number of pattern cycles based on the results latency when a test is resumed after a reset of the pattern controller.

11. A digital test instrument as defined in claim 1, wherein the synchronization unit comprises a condition logic finite state machine having a results input to receive pass/fail results, a control input to switch from the no-result indication to the pass/fail results after the preset number of pattern cycles and an output to provide pass and fail conditions.

12. A method for digital testing comprising:
generating, in a pattern controller, a sequence of test patterns, responsive, at least in part, to a pass/fail result;
supplying the generated sequence of test patterns to a unit under test;
determining a pass/fail result for at least one supplied test pattern in response to result values received from the unit under test, wherein the pass/fail result is available after a results latency;
providing a no-result indication to the pattern controller during a preset number of pattern cycles following the start of a test, the preset number of pattern cycles based on the results latency; and
providing pass/fail results to the pattern controller after the preset number of pattern cycles.

13. A method as defined in claim 12, wherein supplying the generated sequence of test patterns comprises supplying pattern information to individual channels of the unit under test.

14. A method as defined in claim 13, wherein determining a pass/fail result comprises determining a logical combination of individual channel result values.

15. A method as defined in claim 12, wherein generating a sequence of test patterns comprises altering the sequence of test patterns in response to the pass/fail result.

16. A method as defined in claim 12, further comprising setting the number of pattern cycles during which the no-result indication is provided to the pattern controller based on a specified value of the results latency.

17. A method as defined in claim 12, further comprising providing the no-result indication to the pattern controller during the preset number of pattern cycles based on the results latency when a test is resumed after a reset of the pattern controller.

18. A method for digital testing comprising:
- generating, in a pattern controller, a sequence of test patterns, responsive, at least in part, to a pass/fail result;
- supplying the generated sequence of test patterns to a unit under test;
- determining a pass/fail result for at least one supplied test pattern in response to result values received from the unit under test;
- selecting a results condition comprising a no-result indication during a preset number of pattern cycles following the start of a test and selecting a results condition comprising pass/fail results after the preset number of pattern cycles; and
- providing the selected results condition to the pattern controller.

19. A method as defined in claim 18, wherein generating a sequence of test patterns comprises altering the sequence of test patterns in response to the pass/fail result.

20. A method as defined in claim 18, wherein the pass/fail result is available after a results latency, further comprising setting the number of pattern cycles during which the no-result indication is selected based on the results latency.

* * * * *